United States Patent

Hanson et al.

[11] Patent Number: 5,374,504
[45] Date of Patent: Dec. 20, 1994

[54] RESIST MATERIALS AND PROCESSES OF THEIR USE

[75] Inventors: James E. Hanson, New Providence; Anthony E. Novembre, Union, both of N.J.

[73] Assignee: AT&T Corp., Murray Hill, N.J.

[21] Appl. No.: 60,468

[22] Filed: May 11, 1993

Related U.S. Application Data

[63] Continuation of Ser. No. 702,564, May 20, 1991, abandoned.

[51] Int. Cl.$^5$ .............................................. G03F 7/004
[52] U.S. Cl. ................................. 430/325; 430/326; 430/270; 430/921
[58] Field of Search ............... 430/326, 325, 270, 921; 522/33, 36, 39, 57, 59

[56] References Cited

U.S. PATENT DOCUMENTS

| | | | |
|---|---|---|---|
| 3,615,467 | 10/1971 | Poot et al. | 430/326 |
| 3,779,778 | 12/1973 | Smith et al. | 430/270 |
| 4,708,925 | 11/1987 | Newman | 430/326 |
| 4,996,136 | 2/1991 | Houlihan et al. | 430/313 |

OTHER PUBLICATIONS

Lin, B. J., *Journal of Vacuum Science and Technology*, vol. 12, p. 1317 (1975).

*Primary Examiner*—Christopher D. Rodee
*Attorney, Agent, or Firm*—Bruce S. Schneider

[57] ABSTRACT

Resist materials sensitive to actinic radiation are formed from an acid generator and a material sensitive to acid. The acid from the acid generator interacts with the acid sensitive material to produce a change in solubility. Particularly useful acid generators included benzyl and naphthylmethyl sulfones.

7 Claims, No Drawings

RESIST MATERIALS AND PROCESSES OF THEIR USE

This application is a continuation of application Ser. No. 07/702,564, filed on May 20, 1991 now abandoned.

BACKGROUND OF THE INVENTION

1. Field of the Invention

This invention relates to processes for fabricating devices using photosensitive materials and in particular to processes employing a photosensitive material including an acid generator.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to fore a plurality of devices. The coating material, i.e., the resist, is then subjected to light that has been passed through a mask material so that the light reaching the resist corresponds to a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with other methods such as electron lithography.

One resist material, poly(methyl methacrylate) (PMMA) upon exposure with ultraviolet actinic radiation has shown resolution better than that achieved with exemplary resists used at conventional wavelengths (greater than 300 nm). For example, PMMA has been shown to be capable of resolution as good as about 250 nm. (See B. J. Lin, Journal of Vacuum Science and Technology, 12, 1317 (1975).) Although PMMA exhibits excellent resolution, its sensitivity to practical sources of actinic radiation is quite limited. Therefore, exposure times are generally excessive for practical applications.

Another suggested photoresist employs a compound that produces an acid moiety upon deep UV irradiation and a polymer that reacts in the presence of the generated acid to produce acidic substituents. Typical acid generator/acid sensitive polymer combinations include an onium salt e.g., triphenylsulfonium hexafluoroarsenate as the photosensitive acid generator and a polymer such as poly(p-t-butoxycarbonyloxystyrene) (PTBS) as the polymer having a reactive substituent.

Organic acid generators for use in acid generator/acid sensitive polymer combinations have been proposed. These acid generators include a variety of dinitro benzyl compounds as disclosed in U.S. Pat. No. 4,996,136 dated Feb. 26, 1991 which is hereby incorporated by reference. These acid generators have been shown to have good sensitivity to deep UV radiation. However, the materials are relatively costly and therefore acid generators with appropriate sensitivity and at decreased expense are very desirable.

SUMMARY OF THE INVENTION

Excellent sensitivities to deep UV and x-ray exposure as well as sensitivity to electron beam exposure is achieved in an acid generator/acid sensitive polymer combination by employing an acid generator of the formula:

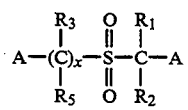

where x is either zero or one; $R_1$, $R_2$, $R_3$, and $R_5$ typically are individually either hydrogen, lower alkyl, or substituted lower alkyl; A is an aromatic cyclic, a carbonyl, or a cyano moiety. It is possible to use $R_4$ and $R_6$ substituents respectively on the A moiety on either side of the molecule when A is not cyano. These $R_4$ and $R_6$ are chosen to yield desired radiation sensitivity, solubility, or reactivity properties.

$R_4$ and $R_6$ moieties are chosen to yield the desired degree of sensitivity and to adjust other desired properties. For example, if either $R_4$ or $R_6$ is employed as a halogen, the increased absorption of x-ray radiation by this halogen substantially enhances sensitivity. Similarly, the use of an alkoxy substituent for $R_4$ or $R_6$ enhances absorption of deep UV radiation. These substituents are also useful in adjusting the $pK_a$ of the acid generated upon exposure-alkoxy substituents increase $pK_a$ while halogens decrease $pK_a$. For some applications it is desirable to employ a relatively weak acid ($pK_a$ in the range 2 to 5) to avoid undesirable reactions with environmental base (see U.S. patent application Ser. No. 07/575047 dated Aug. 30, 1990 (Chandross et al 50-1-16-22-25) which is hereby incorporated by reference for an example of difficulties with an environmental base). Additionally, if R4 or $R_6$ is an acid labile group such as t-butoxy, the (aromatic) sulfone acts as both the acid generator and the acid sensitive compound. In such situations, a soluble matrix polymer such as polyhydroxystyrene, that need not be sensitive to acid, is employed. The acid generator inhibits dissolution of the polymer. The generation of acid and subsequent reaction of the acid labile group causes dissociation of the acid generator, loss of its dissolution inhibition properties, and thus substantially enhances the solubility in base of the combined resist material in the exposed region allowing development of the desired pattern. Additionally even if no acid labile group is present the acid generator acts as dissolution inhibitor for base-soluble polymers and subsequently generated acid allows development in base.

DETAILED DESCRIPTION

As previously discussed, the solubility of the resist material is dependent on reactions induced by the radiation generation of an acid. Two approaches for producing a change in resist solubility are possible. In the first approach an acid sensitive polymer is present together with the acid generator. The polymer is chosen so that it reacts under the influence of the generated acid to produce a composition having substantially different solubility from the original polymeric material. In a second approach a polymer is chosen to be substantially soluble in a desired developer. A photoacid generator with an acid labile group is employed. This material in its unreacted state is present at sufficient concentrations in the polymer to make the combination substantially insoluble in the developer. Generated acid and subsequent reactions with the acid labile group destroys the dissolution inhibiting properties of the acid generator and allows solubility of the polymer matrix in the developer. In this environment, the polymer itself does not undergo reactive change but its dissolution is merely inhibited by the unreacted acid generator.

In the first embodiment, the exposed material relative to the unexposed material has both a different molecular weight and a different acidity. By utilizing this difference, it is possible to employ the resist both as a negative and positive resist. (As a positive resist, the exposed region is removed by utilizing a solvent for the exposed region, while in a negative resist the unexposed resist is removed by utilizing a suitable solvent.) In either case, if the ratio of the rate of dissolution of the photosensitive composition before irradiation compared to that after irradiation is taken as 1:n, then n should not be less than 2 and preferably should be more than 10 for a positive image (not more than 0.5 and preferably less than 0.1 for a negative image). Solubility ratios outside this range typically produce low contrast and inferior image quality. Generally, if a negative image is desired, a solvent is chosen to avoid the production of swelling in the material remaining after dissolution. Similarly, if a positive image is desired, a solvent is chosen so as not to dissolve a substantial thickness of the unexposed region and to avoid swelling in the unexposed regions.

The solution rate of the exposed material to be removed depends on the number of acid labile groups present (whether on the acid generator or on the polymer), the concentration of acid generating moieties, and the rate of reaction between the two. For the situation where both moieties are on one molecule the ratio between the two is substantially limited and such molecules produce acceptable results. For a polymer having the acid labile groups typically, to maintain a suitable difference in solubility between exposed and unexposed regions, it is desirable that the mole percentage between acid generator and acid labile group be between 0.5 and 20 mole percent. Percentages outside this range generally lead to decreased sensitivities.

Where a matrix polymer soluble in a developer is employed, the acid generator molecule should be present typically in a concentration from 1 to 20 mole percent. Typical of suitable materials as matrix polymers are polyhydroxystyrene, novolac resins, and maleimide-styrene copolymers. Typical of polymers having acid sensitive substituents are those described in U.S. Pat. No. 4,996,136 which is hereby incorporated by reference. A variety of acid labile substituents for use on the radiation acid generator or on the polymer material are available. Exemplary of such substituents on the acid generator are t-butoxy, t-butoxycarbonyloxy, t-amyloxycarbonyloxy, t-butylcarboxylate and tetrahydropyranyloxy as $R_4$ or $R_6$. These substituents are generally chosen so that they do not undergo spontaneous thermal degradation at processing temperatures and so that they do not unacceptably affect the composition glass transition temperature. Additionally, an acid labile group need not be present on the radiation sensitive acid generator for use in a matrix polymer since the generated acid allows subsequent dissolution in base.

The polymer component should preferably have a glass transition temperature higher than 30° C., more preferably higher than 50° C. For glass transition temperatures substantially lower than 30° C. there is a tendency for pattern distortion. Typical monomers yielding polymers having suitable glass transitions are t-butoxycarbonyloxystyrene and t-butylvinylbenzoate. Generally, the resist material is deposited on a device substrate by conventional techniques such as spinning. Thicknesses in the range of 0.2 to 2µm are typically employed to avoid substantial pinhole formation and yet yield acceptable resolution.

The acid generating material should be a composition represented by the formula:

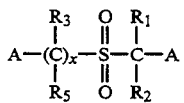

where x is either zero or one; $R_1$, $R_2$, $R_3$, and $R_5$ are individually typically either hydrogen, lower alkyl (6 or less carbon atoms), or substituted lower alkyl; A is an aromatic cyclic moiety, a carbonyl moiety such as acetophenone, or a cyano moiety; and where any cyclic aromatic or carbonyl moiety present in A is substitutable with $R_4$ and $R_6$ (respectively for either side of the sulfone); these substituents $R_4$ and $R_6$ may be hydrogen or individually are chosen to yield desired radiation sensitivity, solubility, or reactivity properties. ($R_4$ and $R_6$ represent either one substituent or a plurality of substituents when A is an aromatic system.) (The substituents $R_1$, $R_2$, $R_3$, $R_5$ are chosen primarily to yield a stable acid upon radiation but also to yield the same desirable properties as $R_4$ and $R_6$.)

Typical substituents for $R_4$ and $R_6$ include lower alkyl (less than 6 carbon atoms), halogen, and lower alkoxy (less than 6 carbon atoms). The substituents, $R_4$ and $R_6$, are typically employed to adjust desired properties. In one embodiment either $R_4$ or $R_6$ as previously discussed is chosen to be an acid labile moiety. The moieties $R_4$ and/or $R_6$ are also chosen, if desired, to enhance the efficiency of acid generation upon irradiation. Moieties such as methoxy enhance yield of acids upon irradiation with deep UV radiation (radiation in the wavelength range 200 to 300 nm). Moieties such as halogens enhance yield of acid moieties upon irradiation with x-radiation (radiation in the range 4 to 140 Å) and moieties such as halogens yield acid entities upon radiation with an electron beam.

An appropriate optical density in the wavelength range to be used for exposure enhances resist quality. Optical densities below 0.05 per µm yield ineffective absorption of the exposing radiation, while optical densities above 0.75 per µm do not yield sufficient light to reach the region of the resist film furthest removed from the ambient/resist film interface.

A particularly advantageous property of aromatic sulfone acid generator materials is that they decompose at relatively high temperatures, e.g., temperatures up to 300° C. Generally, post-exposure baking should be done at a temperature below the acid generation decomposition temperature. However, the higher the temperature of the post-exposure bake, the more efficient the interaction with acid, and therefore the greater the sensitivity to exposing radiation. Thus, the aromatic sulfones such as benzyl and naphthylmethyl sulfones of the invention yield an enhanced sensitivity per acid generator than generally achieved.

The use of the resist material, including a suitable polymer and a radiation sensitive acid generator, involves the coating of the wafer to be processed. These resist materials are typically coated onto a substrate, e.g., a semiconductor-based wafer such as a silicon wafer that is being processed to form semiconductor devices and exposed to deep UV radiation (or electrons or x-rays) to delineate a pattern for a subsequent process such as an etching or metallization process. During the processing of semiconductor wafers it is possible to form the radiation sensitive body by depositing the resist on a substrate surface that includes a semiconductor material, an insulator, such as a silicon oxide, a metal, or a combination of these materials. Exemplary of other suitable substrates are chromium mask blanks and x-ray mask blanks. The coating process is conventional. Typically, the polymer is dissolved in a suitable solvent such as cyclohexanone, the solution is filtered and then placed on the wafer to be coated, and the wafer is spun. The spinning procedure distributes the solution essentially uniformly on the surface of the wafer, and also causes the evaporation of a substantial percent of the solvent. In this manner, films in the thickness range 0.2 μm to 2.0 μm (representative of thicknesses employed in lithography) are produced on an appropriate substrate material such as a silicon or GaAs wafer being processed into semiconductor devices.

After coating, the material is preferably prebaked to remove any remaining solvent. Pre-exposure baking temperatures in the range 80 to 200 degrees Centigrade for times in the range 30 seconds to 10 minutes are desirable. The A substituent should be chosen so that the acid generator remains solid at the pre-exposure bake temperature. The resist material is then exposed to energy such as deep UV light, x-rays, or electrons. Typical doses in the range 5 to 300 mJoules/cm² for deep UV light are employed. (Approximately 30 to 120 μcoulombs/cm² doses for electron and 5 to 50 mJoules/cm² x-ray irradiation are useful.) Conventional exposure techniques such as described in *Introduction to Microlithography*, eds. L. F. Thompson, C. G. Wilson and M. J. Bowden, ACS Symposium, Series 219, pp. 16–82 (1983), Washington, D.C. are employed to delineate the radiation sensitive material. It is then desirable to post-bake the exposed material. Generally, post-bake temperatures in the range 90 to 160 degrees Centigrade for time periods from 20 seconds to 5 minutes are effective. Heating means such as a convection oven and a hot plate baking apparatus such as sold by Brewer Sciences are useful. Solvents suitable for developing the exposed image are materials such as water/tetramethylammonium hydroxide water/NaOH, or lower alkyl alcohol mixtures of lower alkyl alcohols such as isopropanol, ethanol, and methanol with or without water for a positive image and anisole for a negative image.

Acid generators where A is a cyano are available commercially. Other acid generated materials of the invention are synthesized through conventional techniques. For example, a benzyl (or aromatic) chloride of the formula:

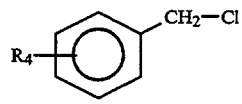

is reacted in dimethylformamide with heating in the presence of $Na_2S_2O_4$ to yield the material shown in formula (4).

Alternatively, a benzyl (or corresponding aromatic) mercaptan such as:

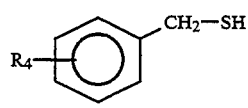

is reacted with a benzyl (or corresponding aromatic) chloride in the presence of base to yield

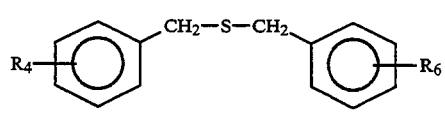

This compound is then reacted in the presence of hydrogen peroxide or other oxidizing agents to yield

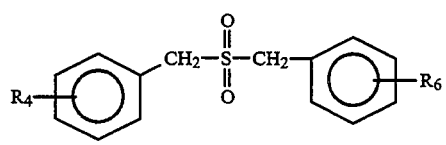

To make unsymmetric compounds, a thiophenol (or corresponding aromatic) reactant is reacted with a benzyl (or corresponding aromatic) chloride to yield

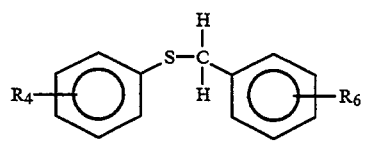

This compound is then reacted with hydrogen peroxide or other oxidizing agents to yield

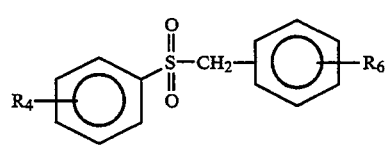

Starting materials for these reactions are produced by the following reactive sequences

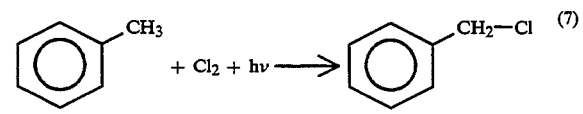

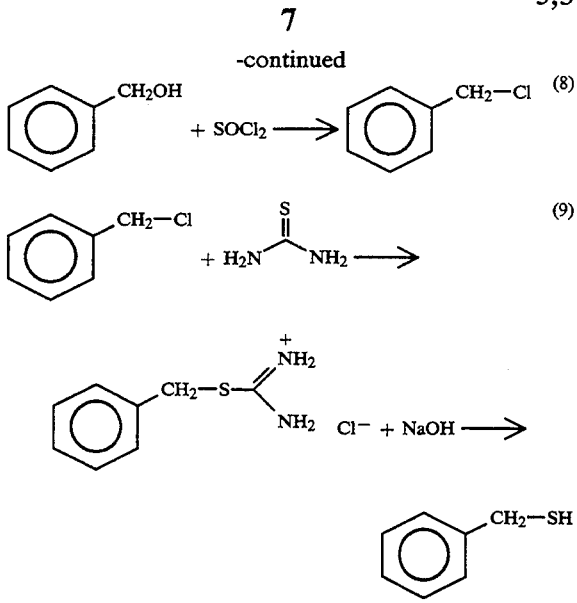

(On compounds 1-6 hydrogens are replaceable with $R_1$, $R_2$, $R_3$ and $R_4$ while phenyl moieties in the compounds of 1-9 are replaceable by corresponding cyclic aromatics. When hydrogens are replaced, the products of reactions 7, 8, and 9 are changed by a corresponding replacement in the reactants.) Corresponding reactions are appropriate where A is a carbonyl such as acetophenone rather than an aromatic moiety attached directly to the sulfonyl or methylene entity.

The following examples are illustrative of the conditions employed to produce the inventive photosensitive materials and to delineate patterns within them.

EXAMPLE 1

Preparation of a variety of sulfones was performed as follows:

Bis(4-methoxy benzyl) sulfone

To a well-stirred suspension of 6.93 grams (40 mmol) of sodium hydrosulfite ($Na_2S_2O_4$) in 70 ml N, N-dimethylformamide (DMF) was added 4.85 grams (31 mmol) of 4-methoxy benzyl chloride. The mixture was stirred for five hours at room temperature, then brought to 85° C. for 24 hours. The mixture was poured onto 250 ml of crushed ice, and the total volume brought to 700 ml with water. The hygroscopic solid product was isolated by filtration and recrystallized from toluene to give 2.9 grams (9.5 mmol, 61% yield) of bis(4-methoxy benzyl) sulfone as white plates (mp 182° C.).

Bis(1-naphthylmethyl) sulfone

To a well-stirred suspension of 7.3 grams (42 mmol) of sodium hydrosulfite ($Na_2S_2O_4$) in 30 ml DMF was added 5.0 grams (28.3 retool) of 1-chloromethylnaphthalene. The mixture was stirred at room temperature for 12 hours, then brought to 85° C. for 24 hours. The warm mixture was poured onto 400 ml crushed ice, and the total volume brought to 700 ml with water. The precipitated solids were filtered to give 4.91 grams (14.2 mmol, 100% yield) of bis(1-naphthylmethyl) sulfone. Pure material was obtained by recrystallization from toluene (mp 220° C.).

Bis(3,4-dichloro benzyl) sulfone

To a well-stirred suspension of 6.48 grams (37.2 mmol) of sodium hydrosulfite ($Na_2S_2O_4$) in 75 ml DMF was added 4.9 grams (25 mmol) of 3,4-dichloro benzyl) chloride. The mixture was stirred at room temperature for 5 hours, then brought to 85° C. for 18 hours. The warm mixture was poured onto 300 ml crushed ice, and the total volume brought to 700 ml with water. The precipitated solids were isolated by filtration. Recrystallization from toluene gave 2.26 grams (5.9 mmol, 47%) pure bis(3,4-dichloro benzyl) sulfone as white needles (mp 177° C.).

Bis(4-fluoro benzyl) sulfone

To a well-stirred suspension of 6.95 grams (40 mmol) of sodium hydrosulfite in 100 ml DMF was added 5.10 grams (35.3 mmol) of 4-fluoro benzyl chloride. The mixture was stirred at room temperature for five hours, then brought to 85° C. for 20 hours. The warm mixture was poured into 400 ml ice, and the total volume brought to 700 ml with water. The solid precipitates were isolated to give 2.3 grams (8.1 mmol; 46% yield) of bis(4-fluoro benzyl) sulfone. Recrystallization from toluene gave the pure compound as white needles (top 193° C.).

EXAMPLE 2

Films were prepared and exposure was performed as follows:

Preparation of Resist Solution

Approximately 1.05 grams of a 2:1 4-t-butoxycarbonyloxystyrene: sulfur dioxide copolymer and 0.192 grams of bis(3,4-dichloro benzyl) sulfone was dissolved in 15 ml of cyclohexanone. The solution was filtered two times through a stack of 1.0, 0.5, 0.2 μm Teflon ® filters.

Preparation of Resist Films

Prior to application of the resist solution a 4" silicon (100 plane) water was primed by exposing the wafer to vapors of hexamethyldisilazane for 5 minutes at 120° C. The above resist solution was applied by spin coating. The wafer was spun at 3320 rpm for 2 minutes and approximately 3 ml of solution was used. The wafer was then vacuum hot plate baked at 105° C. for 2 minutes in air. The thickness of the resulting film was 5750 Å.

Exposure

The resist film was subjected to a series of x-ray synchroton radiation doses using the Alladin electron storage ting located at the University of Wisconsin, Madison. The storage ting operates at 800 MeV and doses ranging from 50 to 400 mJ/cm² were used. Exposures were performed on a beamline containing a 25 μm beryllium window and the exposure chamber pressure was set at 100 Torr of helium. The exposure wavelength was centered at 8 Å and flux of the x-radiation was 0.20 mW/mA cm. The mask employed was a simple stainless steel mask containing 7 openings in which varying exposure times (doses) were applied to each open area in the mask. After exposure the wafer was post-exposure baked on a vacuum hot-plate at 140° C. for 2.5 minutes in air. The wafer was then immersion developed for 60 seconds in a 0.17N tetramethyl ammonium hydroxide solution and rinsed for 20 seconds in DI water. Thicknesses of the film remaining in the exposed areas were taken using a Tencor Alpha-Step profilometer. The minimum dose ($D_s$) necessary to dissolve an exposed area in the developer was 125 mJ/cm², whereas in the absence of bis(3,4-dichloro benzyl) sulfone $D_s$ was greater than 300 mJ/cm$^2$.

EXAMPLE 3

The procedure of Example 2 was followed, except the wafer was post-exposure baked at 145° C. for 2.5 minutes the minimum dose obtained was 60 mJ/cm$^2$.

EXAMPLE 4

The procedure of Example 2 was followed, except approximately 1.05 grams of a 2:1 t-butoxycarbonlyoxystyrene: sulfur dioxide (TBS/SO$_2$) copolymer and approximately 0.123 grams of 2-methyl benzyl phenyl sulfone was dissolved in 15 ml of cyclohexanone. The resist solution was spun on at 3550 rpm to yield a film thickness of 5250 Å. The minimum dose necessary to dissolve an exposed area in the developer was 175 mJ/cm$^2$.

EXAMPLE 5

The procedure of Example 2 was followed, except approximately 0.140 grams of bis(4-fluoro benzyl) sulfone was added to 15 ml of cyclohexanone and allowed to dissolve. After dissolution approximately 1.05 grams of 2:1 TBS/SO$_2$ copolymer was added. The wafer was spun at 3400 rpm to yield a film thickness of 5265 Å. The minimum dose was 125 mJ/cm$^2$.

EXAMPLE 6

A resist solution was prepared by combining 4.8 grams of a 3.5:1 TBS/SO$_2$ copolymer with 0.956 grams of dibenzyl sulfone by dissolution in cyclohexanone. The solution was filtered as described in Example 2, a silicon wafer was treated as described in Example 2, and the wafer was spun at 3800 rpm. The wafer was then baked at 105° C. for two minutes as described in Example 2. The resulting film thickness was approximately 4400 Å.

The wafer was placed on the sample holder on a 1:1 proximity printer Hampshire Instrument Model 5000P exposure tool. A pulsed laser operating at 0.3 Hz was employed with a dose of 0.6 mJ/cm$^2$ per pulse. The exposure spectrum was between 4–20 Å, centered at 14 Å. The sample was maintained in an environment of 1 atmosphere of helium. Total doses from 5–120 mJ/cm$^2$ were employed. Exposure was performed through a 1.0 μm polysilicon membrane mask containing a patterned 0.4 μm gold x-ray absorber layer. After exposure, the wafer was baked at 140° C. for 2.5 minutes as described in Example 2. Development was also performed as described in Example 2. The resulting minimum dose was 25 mJ/cm$^2$.

EXAMPLE 7

The resist solution was made by dissolving 1 gram of 3:1 TBS/SO$_2$ copolymer and 0.102 grams of (2-methylbenzyl) phenyl sulfone in 10 ml of cyclohexanone. The resist film was formed as described in Example 2 utilizing a spinning speed of 1600 rpm. The wafer was then baked at 125° C. for 90 seconds by the procedure described in Example 2. The thickness of the resist film was 1.0 μm The wafer was then exposed on a Süss Model MA56 mask aligner proximity printer. The exposing wavelength was 248 nm. A pulse rate of 100 Hz with a dose of between 1.4 and 1000 mJ/cm$^2$ was employed. The substrate was maintained in an air environment and a multi-density chrome on quartz mask was employed. Post exposure bake was performed for 2 minutes at 140° C. on a hot plate. Development was accomplished by immersing the wafer for 1 minute in a 0.17 normal aqueous solution of tetramethylammonium hydroxide. The wafer was then rinsed in de-ionized (DI) water for 1 minute. The minimum dose was 200 mJ/cm$^2$.

EXAMPLE 8

The procedure of Example 6 was followed, except the resist solution was formed by dissolving 1 gram of 3:1 TBS/SO$_2$ copolymer and 0.126 grams of bis(4-methoxybenzyl) sulfone in 10 ml of cyclohexanone. The resulting minimum dose was 190 mJ/cm$^2$.

EXAMPLE 9

The procedure of Example 6 was followed, except the resist was formed by dissolving 1 gram of 3:1 TBS/SO$_2$ and 0.144 grams of bis(1-naphthylmethyl) sulfone in 10 mm of cyclohexanone. The minimum dose achieved was 280 mJ/cm$^2$.

We claim:

1. A process for fabricating a device, said process comprising the steps of forming a resist layer on a substrate, exposing said resist to actinic radiation in a desired pattern, and developing said pattern after said exposure, wherein said resist comprises an acid generating material that generates an acid upon said exposure to induce a solubility change in said resist characterized in that said acid generating material comprises a material represented by the formula:

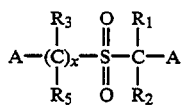

where x is either zero or one; A is an aromatic cyclic, a carbonyl containing moiety, or cyano moiety, and $R_1$, $R_2$, $R_3$, and $R_5$ are chosen so that said acid is stable and where $R_1$, $R_2$, $R_3$, and $R_5$ are individually either hydrogen or lower alkyl or substituted lower alkyl.

2. The process of claim 1 wherein $R_1$, $R_2$, $R_3$ and $R_5$ are all hydrogen.

3. The process of claim 1 wherein A is phenyl or naphthyl.

4. The process of claim 3 wherein A is substituted with a halogen.

5. The process of claim 3 wherein A is substituted with methoxy.

6. The process of claim 1 wherein said acid interacts with an acid sensitive material.

7. The process of claim 1 wherein A is substituted by a moiety chosen to be acid labile so that said acid generating material also functions as an acid sensitive material.

* * * * *